United States Patent
Wang et al.

(10) Patent No.: US 7,590,025 B2
(45) Date of Patent: Sep. 15, 2009

(54) SYSTEMS AND METHODS FOR CLEAN DQS SIGNAL GENERATION IN SOURCE-SYNCHRONOUS DDR2 INTERFACE DESIGN

(75) Inventors: Yong Wang, Shanghai (CN); Liang Zhang, Shanghai (CN); Xin Liu, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 76 days.

(21) Appl. No.: 12/004,177

(22) Filed: Dec. 19, 2007

(65) Prior Publication Data

US 2009/0161452 A1    Jun. 25, 2009

(51) Int. Cl.
*G11C 8/18* (2006.01)
(52) U.S. Cl. .................................... 365/233.1; 365/193
(58) Field of Classification Search ............. 365/233.1, 365/193, 194
See application file for complete search history.

(56) References Cited

U.S. PATENT DOCUMENTS

| | | | | |
|---|---|---|---|---|
| 5,978,281 | A * | 11/1999 | Anand et al. ........... | 365/189.05 |
| 7,385,861 | B1 * | 6/2008 | Zhu ............................. | 365/194 |
| 7,457,175 | B1 * | 11/2008 | Griffith et al. ............... | 365/193 |
| 2008/0031079 | A1 * | 2/2008 | Osawa et al. ............. | 365/233.1 |

* cited by examiner

*Primary Examiner*—Anh Phung
(74) *Attorney, Agent, or Firm*—Finnegan, et al.

(57) ABSTRACT

A method and circuit for generating a signal to synchronize DQ data transfer in memory interface design is presented. The presented method includes receiving a strobe signal having a preamble period before and post-amble period after data transfer burst synchronization signal edge transitions, determining a timing location of the strobe signal preamble period, determining a timing location of the strobe signal post-amble period, and generating a clean strobe signal that tracks the data transfer burst synchronization edge transitions of the strobe signal after the strobe signal preamble begins and before the strobe signal post-amble ends based on the respective determined timing locations of the strobe signal preamble and post-amble periods. In this manner, DQ data transfer may be synchronized according to the burst synchronization signal edge transitions and errors caused by strobe signal level jitter during the preamble and post-amble periods are reduced.

15 Claims, 4 Drawing Sheets

SYSTEMS AND METHODS FOR CLEAN DQS SIGNAL GENERATION IN SOURCE-SYNCHRONOUS DDR2 INTERFACE DESIGN

BACKGROUND

1. Field of the Invention

The present invention relates to semiconductor memory devices and, in particular, to systems and methods for generating data strobe signals for use in accessing data from dynamic random access memory devices.

2. Discussion of Related Art

The increase in computing speeds of modern computing systems has created a demand for developing high speed memory devices. Due to increasing memory speed requirements, a parallel path (i.e. stub bus) memory architecture currently proves impracticable to implement. Accordingly, memory architectures utilizing fully buffered dual in-line memory modules ("FB-DIMM") are commonly used.

FB-DIMM include an array of dynamic random access memory ("DRAM") modules coupled to an advanced memory buffer ("AMB"). A memory controller is serially interfaced with the AMB. Data transfers (e.g. data reads/writes) to the DRAM are commonly performed via the AMB in parallel utilizing a double-data rate two ("DDR2") source-synchronous dynamic random access memory ("SDRAM") architecture. In DDR2 implementations, data transfers are synchronized between the memory controller bus and the SDRAM according to both the rising and falling edges of a bi-directional strobe signal ("DQS"). For example, during data writes to the SDRAM, data ("DQ") writes are driven according to DQS. Similarly, during data reads, DQ is captured according to DQS. DQS is generated by the memory controller during write operations and by the SDRAM during read operations. By synchronizing data transfers according to both the rising and falling edges of DQS, DDR2 implementations allow for twice the data transfer rate than that provided by standard SDRAM without the need to increase the frequency of DQS.

Therefore, in light of the foregoing description, it is desirable to develop systems and methods for generating a DQS signal that only has edge transitions corresponding with DQ data transfer in source-synchronous DDR2 interface designs.

SUMMARY

In accordance with some embodiments of the present invention a method for generating a signal to synchronize DQ data transfer in memory interface design includes receiving a strobe signal having a preamble period before and post-amble period after data transfer burst synchronization signal edge transitions; determining a timing location of the strobe signal preamble period; determining a timing location of the strobe signal post-amble period; and generating a clean strobe signal that tracks the data transfer burst synchronization edge transitions of the strobe signal after the strobe signal preamble begins and before the strobe signal post-amble ends based on the respective determined timing locations of the strobe signal preamble and post-amble periods.

In accordance with some embodiments of the present invention, a digital system for generating a signal to synchronize DQ data transfer in memory interface design includes an input configured to receive a strobe signal having a preamble period before and post-amble period after data transfer burst synchronization signal edge transitions; an input configured to receive a signal indicating the timing location of the strobe signal preamble period; a counter configured to count edge transitions of the received strobe signal that correspond with DQ data transfer following the preamble period and generate a corresponding output signal; a first digital circuit configured to receive the output signal from the counter and a delayed output signal from the counter and to generate an output signal indicating the completion of strobe signal edge transitions corresponding with DQ data transfer based on the result of a logical AND operation performed on the output signal from the counter and the delayed output signal from the counter; a trigger configured to assert a signal indicating when the strobe signal enters and exists the preamble and post-amble periods respectively, based on the signal received from the first digital circuit and the input configured to receive a signal indicating the timing location of the strobe signal preamble period; and a second digital circuit configured to receive the signal generated by the trigger and the received strobe signal and generate a output signal based on the result of a logical AND operation performed on the signal generated by the trigger and the received strobe signal.

Further embodiments and aspects of the invention are discussed with respect to the following figures, which are incorporated in and constitute a part of this specification.

DETAILED DESCRIPTION

When a memory controller bus is idle (i.e., no data transfers are occurring), DQ and DQS may be tri-stated (i.e., not set to either high logic level or low logic level). Prior to initiating a data transfer, DQS may be set to a low logic value during a defined preamble period. Following the preamble period, DQS may switch between high and low logic values coincident with DQ transfer. Once DQ transfer is completed, DQS may be set to a low logic value during a post-amble period. As only DQS transitions occurring during DQ transfer are required to synchronize DQ transfer between the DRAM and the memory controller bus, DQS may be filtered to include only the DQS transitions that are edge aligned with DQ during data transfers. A filtered DQS signal proves useful in ensuring that only valid DQS transitions occurring during DQ transfer are used to synchronize the DRAM with the memory controller bus, and that any DQS transitions corresponding with the DQS preamble and post-amble periods do not affect DQ synchronization.

Figure 1:
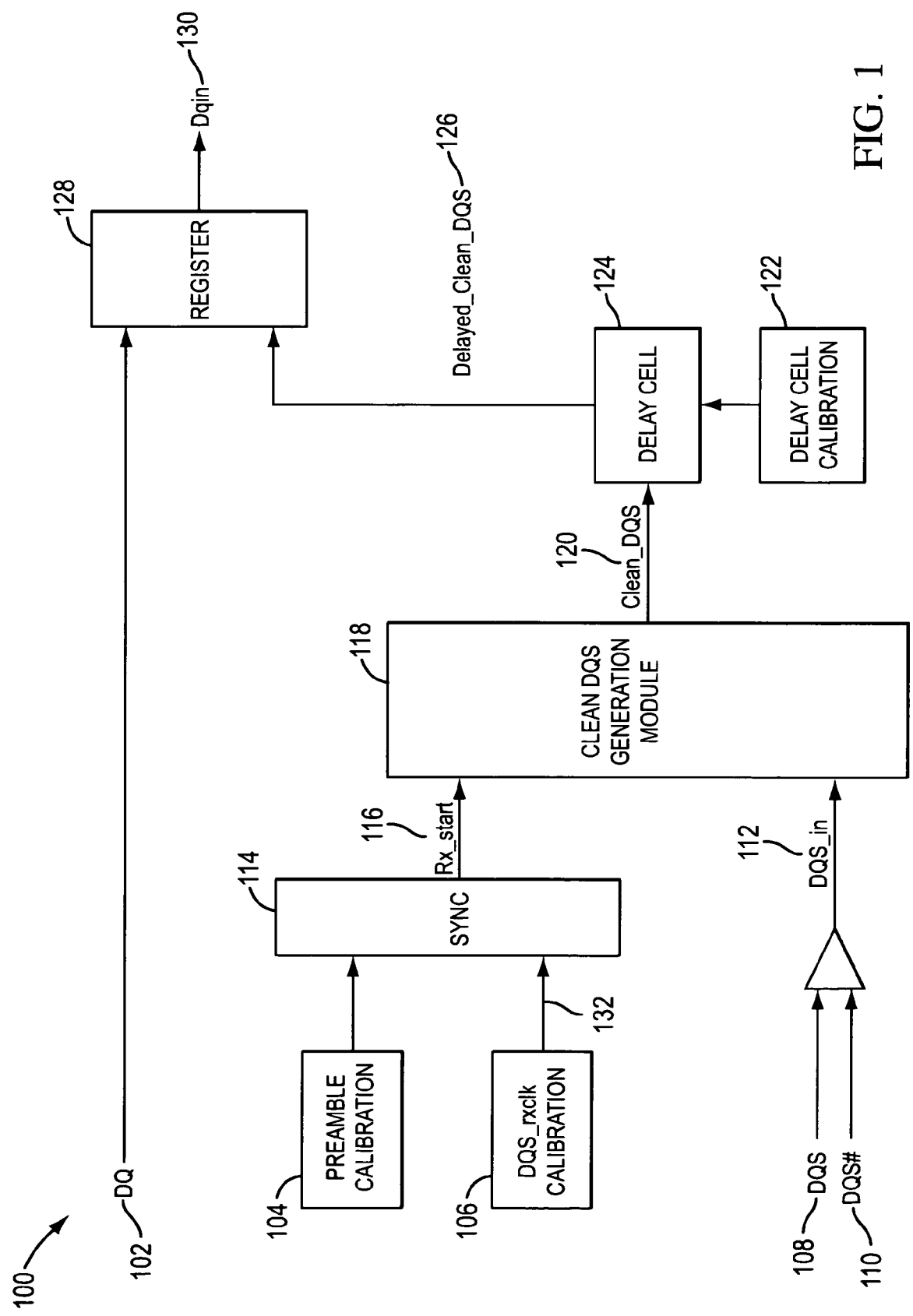
FIG. 1 illustrates a diagram showing exemplary signal levels during a SDRAM read cycle according to some embodiments of the present invention.
Figure 2:
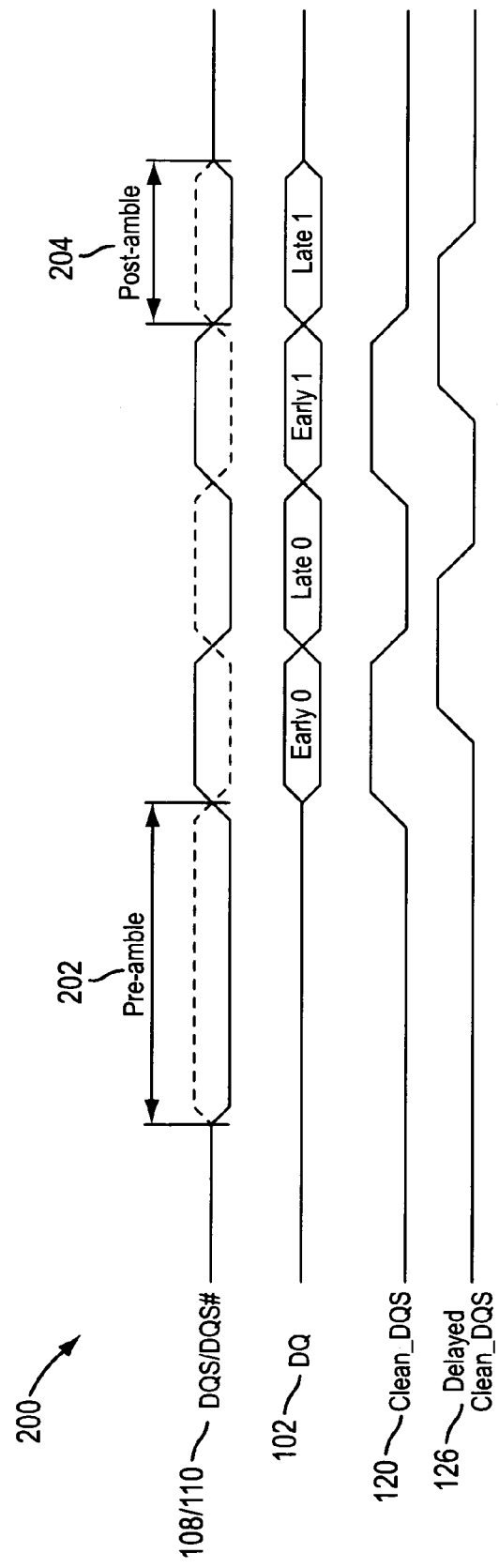
FIG. 2 illustrates a schematic block diagram of a source-synchronous DDR2 memory controller interface system according to some embodiments of the present invention.

FIG. 1 illustrates a schematic block diagram of a source-synchronous DDR2 memory controller interface system 100 according to some embodiments of the present invention. The operation of DDR2 memory controller interface system 100 illustrated in FIG. 1 is explained below with reference to FIG. 2. FIG. 2 illustrates a diagram 200 showing exemplary signal levels 102, 108, 110, 120, and 126 of memory controller interface system 100 during a SDRAM read cycle according to some embodiments of the present invention.

Interface system 100 receives data signal DQ 102. Interface system 100 further receives signals DQS 108 and DQS# 110, which may be multiplexed by interface system 100 into signal DQS_in 112. In some embodiments, DQS 108 and DQS# 110 may generated by interface system 100 internally.

Prior to DQ 102 transfer between the SDRAM and the memory controller, DQS 108 may enter preamble state 202 wherein DQS 108 is set to a low logic value for a pre-defined period. Setting DQS 108 to a low logic level during preamble state 202 allows for capture circuitry in the receiving device to initialize without being prematurely triggered by fluctuations in DQS 108. Prior to DQS 108 entering preamble state 202, DQS_rxclk calibration module 106 may generate signal DQS_rxclk 132 that is phase aligned with a DQS signal 108 sent during an initial calibration period. Upon DQS 108 entering preamble state 202, preamble calibration module 104 may direct synchronization module 114 to assert signal Rx_start 116. The precise timing of when Rx_start 116 is asserted may be varied by synchronization module 114. In some embodiments, when directed by preamble calibration module 104, synchronization module 114 may assert Rx_start 116 in sync with the first falling edge of signal DQS_rxclk 204 occurring during DQS 108 preamble state 202. Preamble calibration module 104 may direct synchronization module 114 to assert Rx_start 115 based on the detected state of DQS signal 108. In some embodiments, Rx_start 116 may be asserted for a duration of one master system clock cycle starting at the midpoint of DQS 108 preamble state 202.

When Rx_start 116 is asserted, clean DQS generation module 118 generates signal clean_DQS 120 having edge transitions that are phase aligned with edge transitions of DQS 108. Clean_DQS 120 is generated by clean DQS generation module 118 only during transfer of DQ 102 by interface system 100. In this manner, clean DQS generation module 118 filters DQS 108 in generating clean_DQS 120 to include only DQS 108 edge transitions that occur after the preamble period 202 and before post-amble period 204.

Transfer of DQ 102 by interface system 100 commences following the DQ 102 preamble period 202. In some embodiments, each DQ 102 transfer may include 4 or 8 bit bursts of DQ 102 data in a complete transfer cycle. During DQ 102 transfer, the SDRAM and the memory controller may synchronize data write/read operations based on edge transitions of clean_DQS 120. Synchronizing DQ 102 transfer according to clean_DQS 120 ensures that only valid DQS 108 transitions are used in synchronizing DQ 102 transfers, thereby eliminating the potential for unintentional triggering of the receiver device capture circuit due to level fluctuations in DQS 108 during the preamble 202 and post-amble 204 periods. After the DQ 102 transfer burst is complete, clean_DQS 120 is reset to a low logic level upon DQS 108 entering post-amble state 204, wherein DQS 108 is again set to a low logic value for a pre-defined period. Clean_DQS 120 remains at a low logic level until it the next DQ 102 data transfer burst occurs.

DQ 102 transferred between the memory controller bus and SDRAM is typically provided coincident to DQS 108 during data transfer. The DDR2 SDRAM standard, however, defines the timing relationship between DQ 102 and DQS 108 differently during SDRAM read and write operations. For write operations, a delayed_clean_DQS 126 signal may be provided by the memory controller such that delayed_clean_DQS 126 edge transition edges occur centered within the DQ 102 signal eye. Timing shifting clean_DQS 120 to generate delayed_clean_DQS 126 allows for effective sampling of DQ 102 according to delayed_clean_DQS 126 and minimizes errors caused by signal jitter. For read operations, as illustrated in FIG. 2, the memory controller receives DQ 102 and clean_DQS 120 edge aligned from the DDR2 SDRAM. Similarly, to effectively sample DQ 102 according to clean_DQS 120 transition edges and minimize the effects of signal jitter, clean_DQS 120 may be delayed such that delayed_clean_DQS 126 transition edges occur centered within the DQ 102 signal eye. Ideally, a delayed_cleaned_DQS 126 signal is phase shifted 90° from the DQ 102 signal. Delaying clean_DQS 110 during read and write operations at the memory controller side of the bus transaction, eliminates the requirement for every SDRAM module to include delay circuitry, thereby reducing overall complexity of the system.

Delayed_clean_DQS 126 may be generated based on clean_DQS 120 in the manner described above using delay cell 124. Delay cell 124 phase shifts clean_DQS 120 to generate delayed clean_DQS 126. As illustrated in FIG. 2, delayed clean_DQS 126 may be used by memory controller 100 to synchronize DQ 102 writes to SDRAM. Similarly, delayed_clean_DQS 126 may be generated using a cleaned DQS signal received from SDRAM during data reads to synchronize transfer from the SDRAM to the memory controller. In some embodiments, delay cell 124 may be calibrated by delay cell calibration module 122 to ensure that delayed clean_DQS 126 edge transitions occur precisely centered within the data eye of DQ 102.

Register 128 receives DQ 102 and delayed_clean_DQS 126, and generates write data Dqin 130 corresponding with DQ 102 values sampled at the rising and falling edge transitions of delayed_clean_DQS 126. In some embodiments, register 128 may comprise a series of positive and/or negative edge flip-flops. Dqin 130 output from register 128 is received and written to the SDRAM module in communication with memory controller 100.

Figure 3:
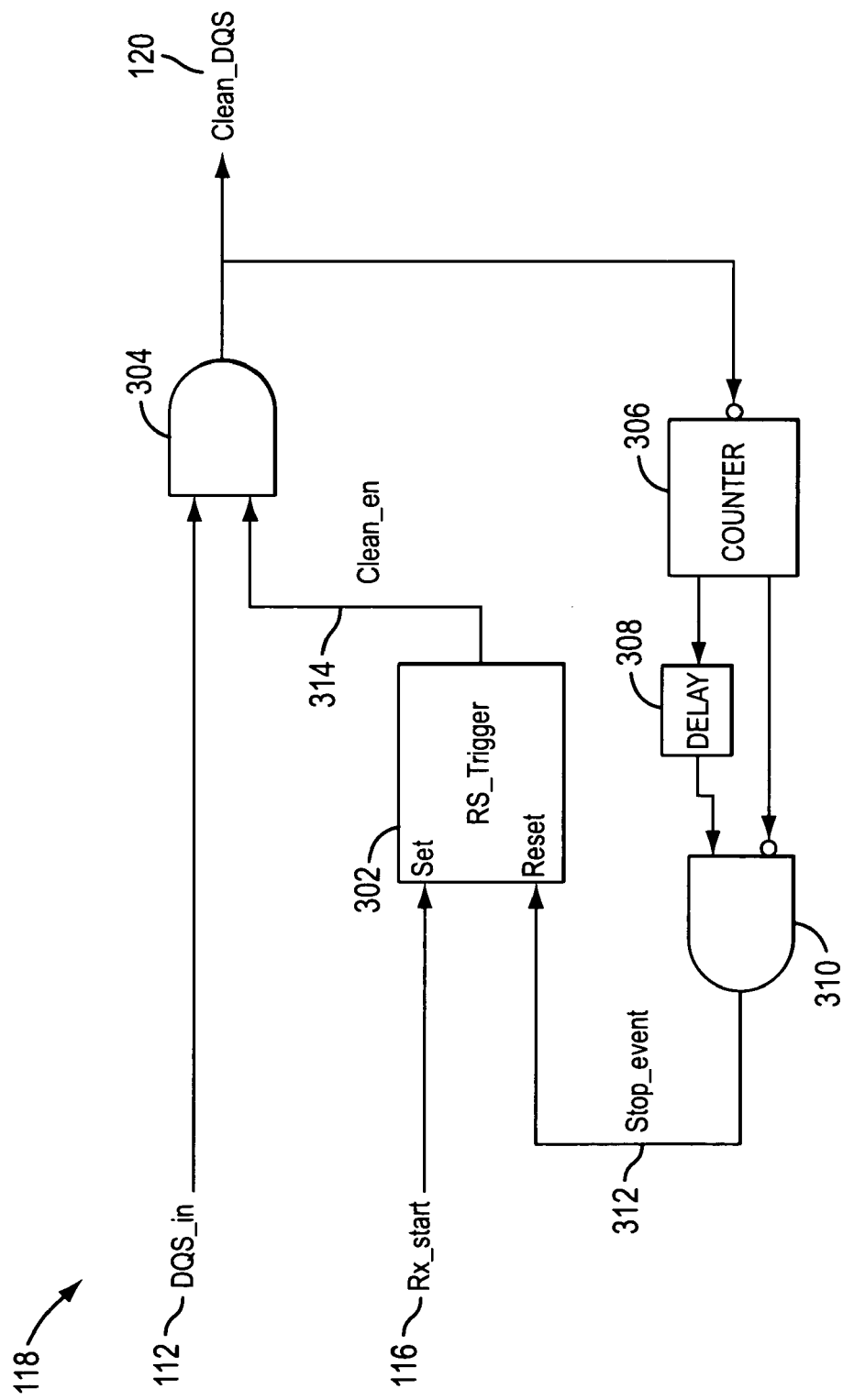
FIG. 3 illustrates a schematic block diagram of a clean DQS generation module according to some embodiments of the present invention.

FIG. 3 illustrates a schematic block diagram of a clean DQS generation module 118 according to some embodiments of the present invention. Clean DQS generation module 118 receives DQS_in 112 and Rx_start 116 signals generated by memory controller 100. AND gate 304 receives signals DQS_in 112 and clean_en 314 as inputs, outputting signal clean_DQS 120. In some embodiments, AND gate 304 may be any digital circuit that is configured to perform a logical AND operation on a plurality of inputs.

Clean_en 314 is set to a high logic level between the beginning of DQS preamble 104 and the end of DQS post-amble 106 by RS trigger 302 (i.e. Set/Reset trigger). When RS trigger 302 receives signal Rx_start 116 during the DQ 102 preamble period 202, clean_en 314 is asserted. Reset of clean_en 314 by RS trigger 203 may occur when signal stop_event 312 is asserted. Once stop_event 312 is asserted, clean_en 314 drops to a low logic level causing output clean_DQS 120 to remain at a low logic level until the next DQ 102 data transfer burst occurs.

Stop_event 312 may be asserted using AND gate 310, delay module 308, and counter 306. In some embodiments, AND gate 310 may be any digital circuit that performs a logical AND operation on a plurality of inputs. Counter 306 receives clean_DQS 120 output from AND gate 304 and counts the falling edge transitions of clean_DQS 120. In some embodiments, counter 306 may be a 1-bit decrement counter used to count clean_DQS 120 transitions during 4-bit DQ 102 data burst transfers. Counter 306 output is delayed by delay module 308 such that the delayed counter 306 output is at a high logic level at the same time the actual counter 306 output is at a low logic level at the last falling data transfer edge transition of DQS_in 112 during a DQ 102 data transfer burst. AND gate 310 receives the delayed output from counter 306 and the inverse of the actual output from counter 306 and generates signal stop_event 312. In this manner, stop_event 312 is asserted only when DQS_in 112 edge transitions occurring during DQ 102 data transfer and DQS_in 216 are complete and DQ 102 has entered the post-amble 106 period.

Figure 4:
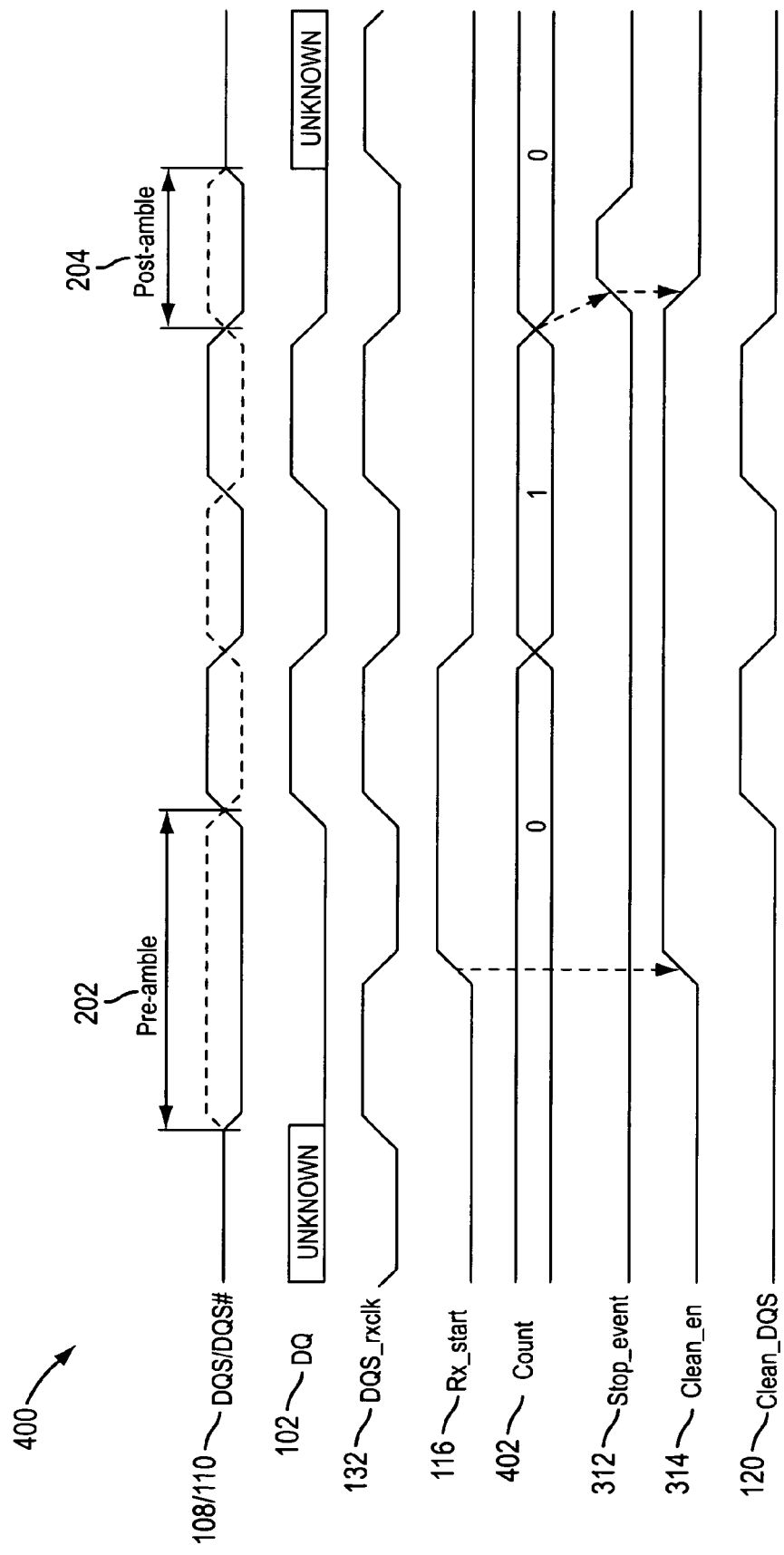
FIG. 4 illustrates a diagram showing exemplary signal levels in a clean DQS generation module according to some embodiments of the present invention In the figures, elements having the same designation have the same or similar functions.

FIG. 4 illustrates a diagram 400 showing exemplary signal levels in clean DQS generation module 118 according to some embodiments of the present invention. Prior to DQ 102 transfer between the SDRAM and the memory controller, DQS 108 may enter preamble state 202 wherein DQS 108 is set to a low logic value for a predefined period. Prior to DQS 108 entering a preamble state 202, DQS_rxclck 132 is phase aligned with DQS 108 edge transitions occurring during DQ 102 data transfer. Rx_start 116 is asserted in the middle of the DQS 108 preamble 202 period. Once Rx_start 116 is asserted, clean DQS generation module 118 internal signal clean_en 314 is also asserted.

While clean_en 314 is asserted, clean DQS 120 is generated by clean DQS generation module 118. Clean_DQS 120 tracks only edge transitions of DQS 108 that correspond with DQ 102 data transfer. Accordingly, DQS 108 edge transitions occurring during DQS 108 preamble 202 and post amble 204 periods are not tracked by clean_DQS 120.

Following preamble 202, transfer of DQ 102 commences. Counter 306 outputs count signal 402 that counts the number of falling edge transitions of signal clean_DQS 120. In an interface system 100 configured for 4-bit DQ 102 burst transfer, counter 306 may be a 1-bit decrement counter. Once count signal 402 indicates that valid DQ 102 transitions are complete, clean DQS generation module 218 signal stop_event 312 may be asserted. When stop_event 312 is asserted, clean_en 314 returns to a low logic value and clean_DQS 120 stops tracking DQS 120 also resetting to a low logic level. This transition occurs during DQS 120 post-amble 204 after the DQ 102 transfer burst is complete. In this manner, clean_DQS 120 only tracks DQS 108 transitions occurring during DQ 102 data transfer.

Other embodiments of the invention will be apparent to those skilled in the art from consideration of the specification and practice of the invention disclosed herein. It is intended that the specification and examples be considered as exemplary only, therefore, the invention is limited only by the following claims.

What is claimed is:

1. A method for generating a signal to synchronize DQ data transfer in memory interface design, the method comprising:
   receiving a strobe signal having a preamble period before and post-amble period after data transfer burst synchronization signal edge transitions;
   determining a timing location of the strobe signal preamble period;
   determining a timing location of the strobe signal post-amble period; and
   generating a clean strobe signal that tracks the data transfer burst synchronization edge transitions of the strobe signal after the strobe signal preamble begins and before the strobe signal post-amble ends based on the respective determined timing locations of the strobe signal preamble and post-amble periods.

2. The method of claim 1, further including phase adjusting the clean strobe signal such that transition edges of the clean strobe signal occur centered within the DQ signal eye.

3. The method of claim 1, wherein the received strobe signal is a DQS signal.

4. The method of claim 1, wherein determining a timing location of the strobe signal preamble period includes determining the midpoint of the strobe signal preamble period.

5. The method of claim 1, wherein determining a timing location of the strobe signal preamble period further comprises:
   generating a signal indicating the timing location of the strobe signal preamble period.

6. The method of claim 1, wherein determining a timing location of the strobe signal post-amble period includes determining the starting point of the strobe signal post-amble period.

7. The method of claim 1, wherein determining a timing location of the strobe signal post-amble period comprises:
   receiving a signal indicating the timing location of the strobe signal preamble period;
   counting the number of edge transitions of the strobe signal following the strobe signal preamble period;
   generating a signal that indicates the timing location of the strobe signal post-amble period based on the counted number of edge transitions following the preamble period and a predetermined number of data bits transferred during each DQ transfer burst.

8. A digital system for generating a signal to synchronize DQ data transfer in memory interface design, the apparatus comprising:
   a first input configured to receive a strobe signal having a preamble period before and post-amble period after data transfer burst synchronization signal edge transitions;
   a second input configured to receive a signal indicating the timing location of the strobe signal preamble period;
   a counter configured to count edge transitions of the received strobe signal that correspond with DQ data transfer following the preamble period and generate a corresponding output signal;
   a first digital circuit configured to receive the output signal from the counter and a delayed output signal from the counter and to generate an output signal indicating the completion of strobe signal edge transitions corresponding with DQ data transfer based on the result of a logical AND operation performed on the output signal from the counter and the delayed output signal from the counter;
   a trigger configured to assert a signal indicating when the strobe signal enters and exists the preamble and post-amble periods respectively, based on the signal received from the first digital circuit and the second input configured to receive a signal indicating the timing location of the strobe signal preamble period; and
   a second digital circuit configured to receive the signal generated by the trigger and the received strobe signal and generate a output signal based on the result of a logical AND operation performed on the signal generated by the trigger and the received strobe signal.

9. The digital system of claim 8, wherein the first digital circuit is an AND gate.

10. The digital system of claim 8, wherein the second digital circuit is an AND gate.

11. The digital system of claim 8, wherein the received strobe signal is a DQS signal.

12. The digital system of claim 8, wherein the output signal of the second digital circuit is a cleaned DQS signal.

13. The digital system of claim 8, further including:
   a delay cell configured to delay the output signal of the second digital circuit such that the output signal edge transitions occur centered within the signal eye of transferred DQ data.

14. The digital system of claim 8, wherein the signal indicating the timing location of the strobe signal preamble period indicates the timing location of the midpoint of the strobe signal preamble period.

15. The digital system of claim 8, wherein the trigger is a Set/Reset trigger.

* * * * *